United States Patent
Dequina et al.

(10) Patent No.: US 7,031,175 B2
(45) Date of Patent: Apr. 18, 2006

(54) SYSTEM AND METHOD OF DETECTING PHASE BODY DIODE USING A COMPARATOR IN A SYNCHRONOUS RECTIFIED FET DRIVER

(75) Inventors: Noel B. Dequina, Bridgewater, NJ (US); Donald R. Preslar, Hillsborough, NJ (US); Paul K. Sferrazza, New Hope, PA (US)

(73) Assignee: Intersil Americas Inc., Milpitas, CA (US)

( * ) Notice: Subject to any disclaimer, the term of this patent is extended or adjusted under 35 U.S.C. 154(b) by 51 days.

(21) Appl. No.: 10/797,437

(22) Filed: Mar. 10, 2004

(65) Prior Publication Data

US 2005/0128776 A1 Jun. 16, 2005

Related U.S. Application Data

(60) Provisional application No. 60/529,859, filed on Dec. 16, 2003.

(51) Int. Cl.
*H02M 7/217* (2006.01)

(52) U.S. Cl. .................. 363/127; 363/17; 323/269; 323/272; 327/102; 327/309

(58) Field of Classification Search ............ 363/16–20, 363/97, 131, 127, 37–41; 323/205, 206, 323/282–288; 320/141, 139, 140, 145
See application file for complete search history.

(56) References Cited

U.S. PATENT DOCUMENTS 6,184,660 B1 * 2/2001 Hatular ........................ 320/141
6,894,461 B1 * 5/2005 Hack et al. .................. 323/205

\* cited by examiner

*Primary Examiner*—Rajnikant B. Patel
(74) *Attorney, Agent, or Firm*—Gary R. Stanford

(57) ABSTRACT

A body diode comparator circuit for a synchronous rectified FET driver including a sample circuit and a comparator. The FET driver has a phase node coupled between a pair of upper and lower switching FETs and is responsive to a PWM signal having first and second phases for each cycle. The sample circuit samples an initial voltage of the phase node during the first phase of the PWM signal and provides a sum voltage indicative of the initial phase voltage added to the voltage level of the phase node during the second phase of the PWM signal. The comparator compares the sum voltage with a predetermined reference voltage and provides an output indicative of an activation state of the lower FET during the second phase of the PWM signal. The FET driver turns on the upper FET when the comparator indicates that the lower FET is off.

20 Claims, 3 Drawing Sheets

SYSTEM AND METHOD OF DETECTING PHASE BODY DIODE USING A COMPARATOR IN A SYNCHRONOUS RECTIFIED FET DRIVER

CROSS-REFERENCE TO RELATED APPLICATIONS

This application claims the benefit of U.S. Provisional Application No. 60/529,859 filed on Dec. 16, 2003, entitled "SYSTEM AND METHOD OF DETECTING PHASE BODY DIODE USING AN AUTO-ZERO COMPARATOR IN A SYNCHRONOUS RECTIFIED MOSFET DRIVER", which is herein incorporated by reference for all intents and purposes.

BACKGROUND OF THE INVENTION

1. Field of the Invention

The present invention relates to PWM power regulators, and more particularly to a method of detecting phase body diode using an auto-zero comparator in a synchronous rectified MOSFET driver.

2. Description of the Related Art

A synchronous rectified field-effect transistor (FET) driver for a power regular includes two switching FETs coupled in series between an input voltage signal and ground at an intermediate phase node. An output inductor has one end coupled to the phase node and its other end coupled to a load. A pulse-width modulation (PWM) feedback circuit toggles activation of the switching FETs to regulate power supplied to the load. PWM logic is responsive to a PWM signal having two logic states indicative of the phases of each PWM cycle. The upper FET is turned on while the lower FET is turned off during one phase of each PWM cycle, and then the upper FET is turned off and the lower FET turned on during the remaining phase of the PWM cycle. Operation toggles in this manner while the PWM control circuit regulates the PWM duty cycle to control power delivered to the load.

Shoot-through protection is designed primarily for preventing premature activation of one of the FETs. Simultaneous activation of both FETs results in significant efficiency degradation and possible damage to the system. Shoot-through protection designs require a fast loop response from the time of detection to the time of FET activation. It is desired that the dead time of both phase edges of each PWM cycle be minimized to improve or otherwise maximize power conversion efficiency. An important dead time to consider is when the body diode of the lower FET starts to conduct indicating that the lower FET is in the off state. Body diode detection is challenging due to phase node variability mainly effected by the voltage drop when the FET is in the on state and the natural oscillation caused by immediate turn off of the FET. In an attempt to reduce dead time, premature detection causes a false detection and late detection increases dead time.

The voltage of the PHASE node is a by-product of the RDSON of the lower FET and the load current on the converter. For example, an RDSON of 5 milliohms and a 20 Ampere (A) load gives a PHASE node voltage drop of approximately 100 millivolts (mV) below ground, or −100 mV. The RDSON may vary depending upon the FET and varies with temperature. Temperature and current load, among other variables, causes changes of the PHASE node voltage from cycle to cycle and over time. Such variables have made it difficult to determine when the lower FET is off and when the upper FET should be activated. In some conventional configurations, the lower FET gate drive signal, referred to as LGATE, was monitored in an attempt to determine when the lower FET was off. In particular, when the LGATE fell to a predetermined voltage level, such as 1.5 Volts (V), it was assumed that the lower FET was off and that the upper FET could be turned on. This solution was somewhat unreliable and inconsistent. The temperature, load and other variables resulted in significant variations from one cycle to the next or over time resulting in unpredictable results and significant inefficiencies. Oftentimes the dead time from when the lower FET is turned off to activation of the upper FET was large significantly degrading efficiency. It is desired to identify the appropriate time to detect the body diode while preventing false triggering and without compromising dead time.

SUMMARY OF THE INVENTION

A body diode comparator circuit for a synchronous rectified FET driver according to an embodiment of the present invention includes a sample circuit and a comparator. The FET driver has a phase node coupled between a pair of upper and lower switching FETs and is responsive to a PWM signal having first and second phases for each cycle. The sample circuit samples an initial voltage of the phase node during the first phase of the PWM signal and provides a sum voltage indicative of the initial phase voltage added to the voltage level of the phase node during the second phase of the PWM signal. The comparator compares the sum voltage with a predetermined reference voltage and provides an output indicative of an activation state of the lower FET during the second phase of the PWM signal. The FET driver turns on the upper FET when the comparator indicates that the lower FET is off.

In this manner, the initial phase node voltage level is sampled and stored and the voltage drop of the phase node relative to its initial level is compared with a predetermined amount for each cycle. Variations that might otherwise compromise detection of the state of the lower FET, such as the type of FET used, load conditions, temperature variations, etc., are compensated by sampling the initial phase voltage level. Thus, dead time between FET activations is minimized and becomes consistent from cycle to cycle thereby improving efficiency and performance.

In one embodiment, first and second voltage sources provide the predetermined reference voltage and a common mode voltage, respectively. A switch circuit stores a first difference voltage between the predetermined reference voltage and the common mode voltage during the first phase of the PWM signal, and applies the first difference voltage to the comparator during the second phase of the PWM signal. In this case, the sample circuit is operative to store a second difference voltage between the common mode voltage and the initial voltage of the phase node during the first phase of the PWM signal, and to provide a sum of the phase node voltage and the second difference voltage to the comparator during the second phase of the PWM signal. In more specific embodiments, capacitors and switches are used to sample and store the respective voltage levels used in the comparisons. The comparator may include a blanking circuit or the like that compensates for initial ringing of the phase node during switching.

A rectified synchronous FET power regulator according to an embodiment of the present invention includes upper and lower FETs, PWM logic and a comparator circuit. The FETs are coupled together at a phase node and between an input voltage signal and a reference terminal of a voltage source. The PWM logic switches the upper and lower FETs based on a PWM signal having first and second states. The comparator circuit detects the activation state of the lower FET, and includes a sample circuit and a comparator. The sample circuit samples an initial voltage of the phase node during the first state of the PWM signal and provides a sum voltage indicative of a sum of the initial voltage and the voltage level of the phase node during the second state of the PWM signal. The comparator compares the sum voltage with a predetermined reference voltage and provides an output indicative of the activation state of the lower FET. The FETs may be implemented as MOSFETs or the like.

A method of detecting the activation state of a lower switching FET of a synchronous rectified FET driver which toggles activation of upper and lower switching FETS coupled together at a phase node, includes storing a first voltage level indicative of the initial voltage level of the phase node while the lower FET is turned on, and determining when the voltage level of the phase node falls below the initial voltage level by a predetermined amount after the FET driver initiates turning off the lower FET.

The method may include comparing a predetermined reference voltage with the first voltage level added to the voltage level of the phase node. The method may include storing a first voltage difference between a common mode voltage and the initial voltage level, storing a second voltage difference between the common mode voltage and a predetermined reference voltage level, and comparing the second voltage difference with a sum of the first voltage difference and the voltage level of the phase node. The storing may include charging capacitors or other storage elements, and switching the capacitors between voltage levels and applying stored voltages to a comparator. The method may include ignoring initial ringing of the phase node immediately after the FET driver initiates turning off the lower FET.

BRIEF DESCRIPTION OF THE DRAWING(S)

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present invention addresses the problem of reducing the phase body diode dead time and achieves consistent cycle-to-cycle dead time in dynamic mode of operation. A system and method of detecting phase body diode using an auto-zero comparator in a synchronous rectified MOSFET driver according to an embodiment of the present invention solves the problem of reducing the body diode dead time regardless of the type of FET used, and during load current conditions and temperature variations. MOSFET drivers with small body diode dead time exhibit an efficiency improvement which is considered as one of the benchmarks of performance. The dead time becomes consistent from cycle to cycle regardless of variations, including temperature, FET type, and current load. The detection point can be set much lower without false triggering due to noise bounce.

In accordance with embodiments of the present invention, the voltage drop on the PHASE node is sampled and stored into a sample and hold capacitor on a cycle-by-cycle basis. When the PHASE node drops below this initial and stored voltage level by a predetermined amount, it is determined that the lower FET is off. During detection, the voltage seen by the comparator is the pre-programmed voltage referenced to the previously stored voltage on the capacitor. In this case, the detection point is maintained by the pre-programmed voltage on the comparator regardless of the stored voltage on the capacitor. In this manner, a consistent dead time is maintained from cycle-to-cycle and reduces or otherwise eliminates and false triggering due to bouncing caused by noise.

Figure 1:
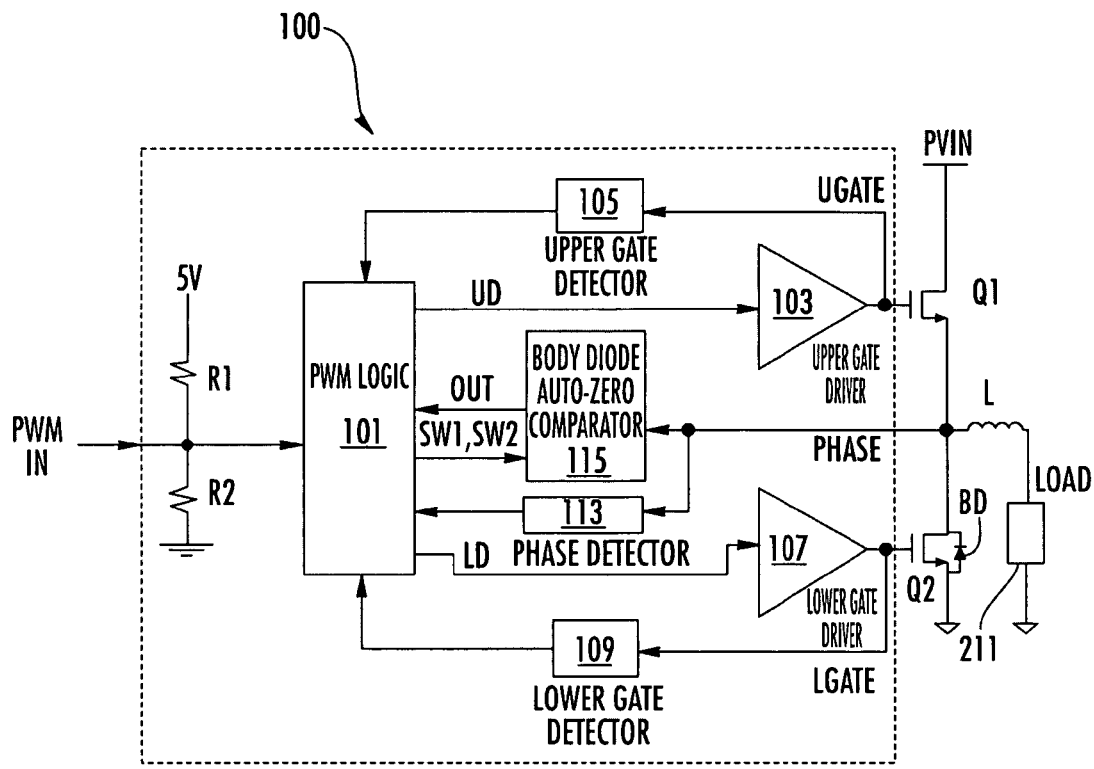
FIG. 1 is a schematic and block diagram of a rectified synchronous MOSFET driver system including an auto-zero comparator according to an exemplary embodiment of the present invention for detecting the phase body diode.

FIG. 1 is a schematic and block diagram of a rectified synchronous MOSFET driver system 100 including an auto-zero comparator circuit 115 implemented according to an exemplary embodiment of the present invention for detecting the phase body diode BD of a lower N-channel metal-oxide semiconductor FET (MOSFET) Q2. A PWM input signal (PWM IN) is provided through pull-up and pull-down resistors R1, R2 relative to a 5V source voltage to the input of PWM logic 201. The PWM IN signal toggles between two states indicative of first and second phases of each PWM cycle. The PWM logic 101 asserts an upper drive signal UD to the input of an upper gate amplifier driver 103 and a lower drive signal LD to the input of a lower gate amplifier driver 107. The driver 103 asserts the UGATE signal at its output, which is provided to the gate of an upper N-channel MOSFET Q1 and fed back to the input of an upper gate detection circuit 105. The upper gate detection circuit 105 feeds back the voltage of the UGATE signal to the PWM logic 101. MOSFETs are used as the switching devices Q1 and Q2 in the embodiment shown, although other types of FET devices including a body diode are contemplated.

The driver 107 asserts the LGATE signal at its output, which is provided to the gate of Q2 and fed back to the input of a lower gate detection circuit 109. The lower gate detection circuit 109 feeds back the voltage of the LGATE signal to the PWM logic 101. The drain of Q1 is coupled to an input source voltage PVIN and the source of Q1 is coupled to a PHASE node, which is further coupled to the drain of the lower FET Q2 and to one end of an output inductor L. The source of Q2 is coupled to ground. The other side of the inductor L is coupled to a load circuit 111 referenced to ground. The PHASE node is coupled to the input of a phase detector circuit 113, which senses the voltage level of the PHASE node fed back to the PWM logic 110.

In the configuration shown, the body diode auto-zero comparator circuit 115 is provided having an input coupled to the PHASE node and an output providing an OUT signal to the PWM logic 101. The PWM logic 101 asserts switch signals SW1 and SW2 to the comparator circuit 115, as further described below. Detection of the PHASE node occurs when the body diode BD of the lower FET passes the detection level, as further described below. The PWM logic 101 receives the OUT logic signal from the comparator 115 and processes ready signals for lower gate and upper gate translation.

Figure 2:
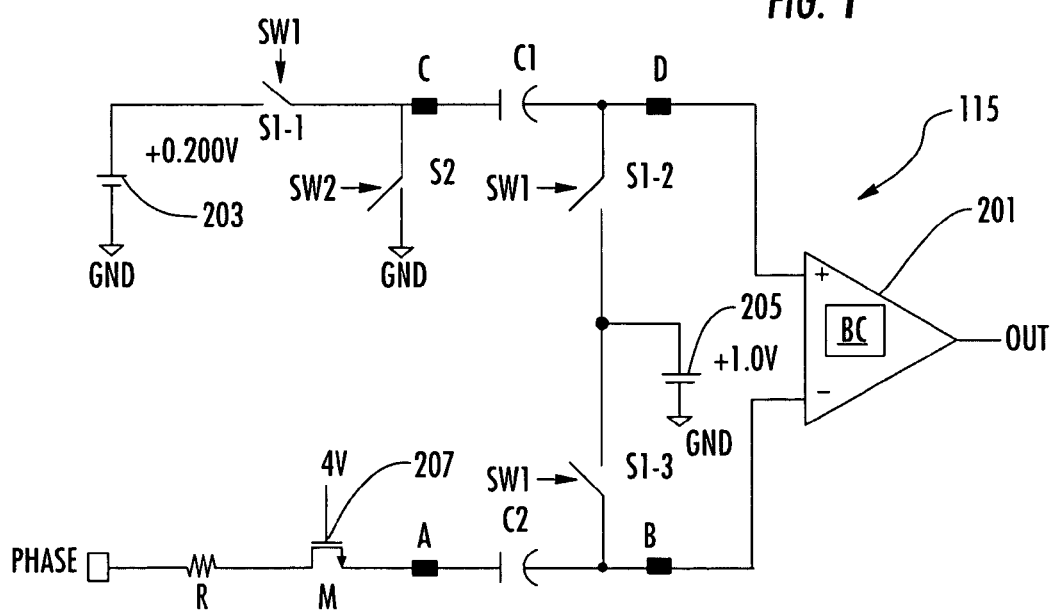
FIG. 2 is a more detailed schematic diagram of the body diode auto-zero comparator circuit of FIG. 1.

FIG. 2 is a more detailed schematic diagram of the body diode auto-zero comparator circuit 115. A high speed comparator 201 has a non-inverting input coupled to a node D, an inverting input coupled to a node B, and an output asserting the OUT signal. The comparator 201 internally incorporates a blanking circuit BC, further described below. Three single-pole, single-throw (SPST) switches S1-1, S1-2 and S1-3 are included and collectively referred to as the S1 switches. The D node is coupled to one terminal of switch S1-2 and to one end of a capacitor C1. The B node is coupled to one terminal of the switch S1-3 and to one end of another capacitor C2. The other terminals of the switches S1-2 and S2-3 are coupled together and to the positive terminal of a +1.0V common mode voltage source 205, having its negative terminal coupled to ground. The other end of the capacitor C1 is coupled to a node C, which is further coupled to one terminal of the switch S1-1 and to one terminal of another SPST switch S2. The other terminal of the switch S2 is coupled to ground. The other terminal of the switch S1-1 is coupled to the positive terminal of a +0.200V reference source 203, having its negative terminal coupled to ground. The other end of the capacitor C2 is a node A, which is coupled to the source of an N-channel double diffused MOS (DMOS) transistor 207. The drain of the DMOS transistor 207 is coupled to one end of a resistor R, which has its other end coupled to the PHASE node. The gate of the DMOS transistor 207 receives a 4V signal.

The PHASE node generally operates within a voltage range of approximately −2V to 22V, while the capacitor C2 and the comparator 201 are 5V devices. The resistor R and the DMOS transistor 207 collectively operate as a voltage limiter that clamps voltage of the A node to a maximum voltage limit level (e.g., 3–4V) when the PHASE node goes to higher voltage levels to prevent excessive voltage levels to 5V devices. Otherwise, while the voltage level of the PHASE node is below the maximum voltage limit level, the A node follows the voltage level of the PHASE node. A DMOS transistor essentially is a special type of MOS transistor manufactured by making an additional lightly doped diffusion on the drain side of the transistor. The additional diffusion causes the effective channel length to be shorter than drawn length. The additional diffusion increases conductivity so that the DMOS transistor has a lower "on" resistance. The additional, lightly doped region in the channel causes the drain-to-source breakdown voltage to increase, so that it can withstand higher voltages (approximately 25–40V) before it breaks down.

The switches S1 and S2 are configured as normally-open and are closed when receiving an activation signal. The switches S1 are closed upon assertion of the activation signal SW1 and the switch S2 is closed upon assertion of the activation signal SW2, which signals are provided from the PWM logic 101 reflective of the state of the PWM IN signal. Alternatively, the PWM logic 101 may assert a single SW activation signal (not shown), which is internally converted by the comparator circuit 115 to generate the SW1 and SW2 signals.

Figure 3:
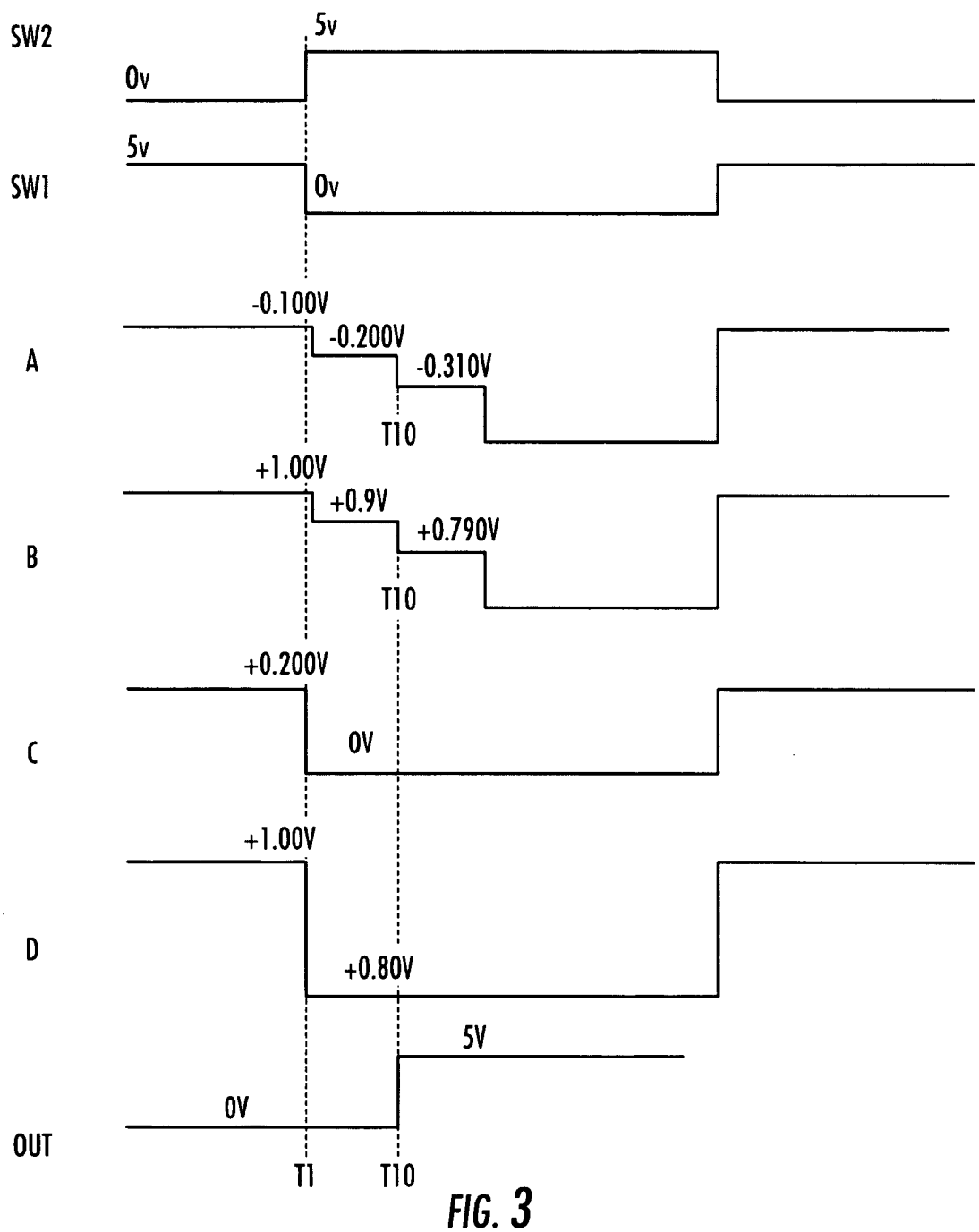
FIG. 3 is a timing diagram illustrating operation of the body diode auto-zero comparator circuit shown in FIG. 2.

FIG. 3 is a timing diagram illustrating operation of the body diode auto-zero comparator circuit 115. The timing diagram shows plots of the activation signals SW1 and SW2, the voltages of the A, B, C and D nodes and the OUT signal. The SW1 and SW2 signals assume the opposite logic states with respect to each other. The SW2 signal is initial low (0V) so that the S2 switch is initially opened. The SW1 signal is initially high (e.g., 5V) so that the S1 switches (S1-1, S1-2 and S1-3) are all initially closed. When the switches S1 are closed, the nodes B and D are charged to 1V from the common mode voltage source 205, and the output signal OUT of the comparator 201 is low (e.g., 0V). The other side of the capacitor C1, at node C, is coupled to 0.2V from the reference voltage source 203. Thus the capacitor C1 has an initial charge of 0.8V, which is the voltage difference between the sources 203 and 205.

The other side of the capacitor C2, at node A, is coupled to the PHASE node. For purposes of illustration, the initial voltage level of the PHASE node while the lower FET Q2 is on is assumed to be approximately −100 mV (or −0.1V) assuming that the RDSON of Q2 is 5 milliohms and that the load 211 is drawing a current level 20A. It is understood, however, that the initial voltage level of the PHASE node varies from cycle-to-cycle and over time depending upon various factors, including, for example, temperature, FET type of Q2, and current of the load 211. While Q2 is on, the capacitor C2 charges to a voltage difference between the initial voltage of the PHASE node and the voltage of the common mode voltage source 205. In the configuration shown, the capacitor C2 charges to 1.1V, which is the common mode voltage of 1V minus the assumed PHASE node voltage of −100 mV.

When the PWM IN signal goes high at time T1, the SW2 signal goes high closing switch S2 and the SW1 signal goes low opening the switches S1. The C node is grounded and thus goes to zero and stays at zero while the S2 switch is closed. The D node switches to the voltage across the capacitor C1, or 0.8V, which is the difference voltage between the sources 203 and 205. The A node, which follows the voltage level of the PHASE node up to the maximum voltage limit, is shown to drop by about −100 mV to −200 mV. The B node becomes a sum voltage being the sum of the voltage of the A node plus the voltage stored across the capacitor C2. Thus, the B node switches to 0.9V, which is the initial voltage of the capacitor C2 (e.g., 1.1V) above the voltage of the A node. While the switch S1-3 is open, the A node follows the voltage of the PHASE node, and the B node follows the voltage of the A node plus the voltage across the capacitor C2.

An initial ringing 401 (FIG. 4) may occur on the PHASE node, which is impressed upon the A and B nodes to the inverting input of the comparator 201. This ringing is not shown in FIG. 3 as it has a relatively short duration, such as less than 5 nanoseconds (ns). The blanking circuit BC provides a short delay, e.g., 5 ns or so, so that the initial ringing is ignored by the comparator 201 to prevent possible premature switching.

At a time T10, the PHASE and A nodes drop by at least 200 mV below the initial voltage of the PHASE node, where the A node is shown as dropping to a voltage level of −0.310V. At this time, the B node drops to about 0.790V, which is just below the voltage of the D node at 0.8V. A short time after the voltage of the B node drops below the voltage of the D node, the comparator 201 asserts the OUT signal high indicating that the lower FET Q2 is off. When the OUT signal provided to the PWM logic 101 goes high, the PWM logic 101 asserts the UD signal to activate the upper FET Q1. A total logic delay, such as less than approximately 20 ns, elapses from when the voltage of B drops below the D node to when the PWM logic 101 asserts the UD signal to activate the FET Q1. This relatively short delay is substantially constant from cycle to cycle, ensures against premature switching, and minimizes the dead time between the switching of the FETs Q1 and Q2.

In summary, the switch circuit including the capacitor C1 and the switches S1-1, S1-2 and S2 operates to initially charge the capacitor C1 with a voltage level indicative of a predetermined reference voltage, such as 0.2V. The sample circuit including the capacitor C2 and the switch S1-3 operates to initially charge the capacitor C2 with a voltage level indicative of the initial voltage of the PHASE node while Q2 is on for the immediate PWM cycle. The initial charge on both of the capacitors C1 and C2 also reflect the common mode voltage applied to each, which is 1.0V in the embodiment shown. The 1.0V precharged common mode voltage is used to optimize common mode range speed of the comparator 201 and the accurate 0.2V source is used as an accurate detector reference voltage. The common mode voltage may be any suitable voltage level, and may be zero. If the voltage source 205 is removed and the switches S1-2 and S1-3 are instead coupled to ground, then the capacitor C1 initially charges to the voltage of the voltage source 203 and the capacitor C2 initially charges to the initial voltage level of the PHASE node. The common mode voltage may be set to any appropriate level to maximize the switching speed of the particular comparator used.

When the PWM phase switches and the PWM logic 101 initiates turning off Q2, the voltage of the capacitor C1 is applied to the non-inverting input of the comparator 201. The sum voltage of the PHASE node and the voltage across the capacitor C2 is applied to the inverting input of the comparator 201. When the voltage of the PHASE node drops from its initial level by the amount of the predetermined reference voltage, indicating that the lower FET Q2 is off, the OUT signal is asserted high indicating that the upper FET Q1 may be turned on. Since the load current varies from cycle-to-cycle (such as due to temperature variations or demands by the load, such as a CPU or the like), and since the FET RDSON is temperature dependent, the voltage of the PHASE node varies from cycle-to-cycle and/or drifts over time. The body diode auto-zero comparator circuit 115 samples the initial PHASE voltage for each cycle and switches when the PHASE voltage drops below the initial amount by the reference amount, such as by 200 mV in the embodiment shown. Thus, the dead time is reduced and is substantially consistent from cycle to cycle regardless of load and temperature conditions among other variables.

Figure 4:
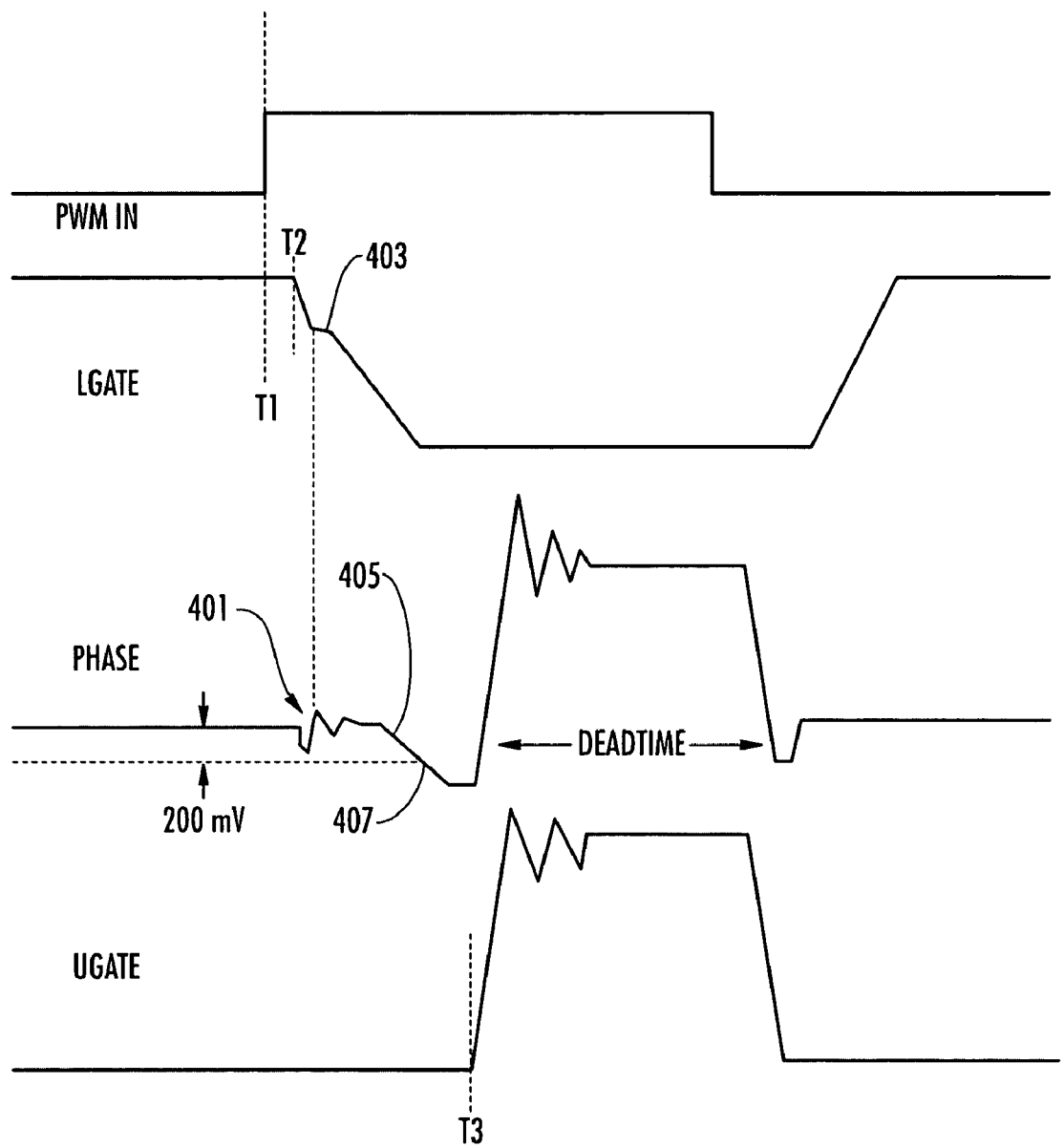
FIG. 4 is a timing diagram of a single-channel MOSFET driver showing shoot-through protection integrated into the driver.

FIG. 4 is a timing diagram of a single-channel MOSFET driver showing shoot-through protection integrated into the driver. The PWM IN signal is plotted along with the LGATE, PHASE and UGATE nodes and corresponding signals. Each node and the signal it carries assume the same name unless otherwise specified. In this case, the PWM IN signal goes high to initiate each PWM cycle and goes low in response to a control condition to terminate each PWM cycle. The UGATE and LGATE signals are low to deactivate (or turn off) and high to activate (or turn on) their respective FET switches Q1 and Q2.

When the PWM IN signal is low, the PHASE node is also low as a result of logical operation. At the time T1, the PWM IN signal goes high to initiate the next cycle. At time T2, the LGATE signal is asserted from high to low by the PWM logic 101 to turn off the lower FET Q1. In response to the LGATE signal decreasing, the PHASE node begins to bounce or oscillate as shown at 401. Such oscillations are reflected as transitions on the LGATE signal shown at 403. Eventually the PHASE node ramps downward as shown at 405, and when the PHASE node drops 200 mV below its initial voltage level, as shown at 407, the OUT signal is asserted to indicate that the upper FET may be turned on. After a short logic delay, the UGATE signal is asserted high at time T3 to turn on the upper FET. When the PHASE node falls below approximately −0.6V, the body diode BD begins to conduct.

As shown in FIG. 4, the slope of the PHASE node shown at 405 in some cases is dramatically slow which is normally a function of the size of the body diode BD built into the FET itself. Body diode detection is challenging due to phase node variability mainly effected by the voltage drop when the FET is in the on state and the natural oscillation caused by immediate turn off of the FET. In an attempt to reduce dead time, premature detection causes a false detection and late detection increases dead time. The present invention identifies the appropriate time to detect the body diode BD without compromising dead time and/or false triggering.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention.

The invention claimed is:

1. A body diode comparator circuit for a synchronous rectified FET driver, wherein the driver is responsive to a PWM signal and has a phase node coupled between upper and lower switching FETs, and wherein the PWM signal has first and second phases for each PWM cycle, said body diode comparator circuit comprising:
   a sample circuit for sampling an initial voltage of the phase node during the first phase of the PWM signal and for providing a sum voltage indicative of said initial voltage added to the voltage level of the phase node during the second phase of the PWM signal; and
   a comparator that compares said sum voltage with a predetermined reference voltage and that provides an output indicative of an activation state of the lower FET during the second phase of the PWM signal.

2. The body diode comparator circuit of claim 1, further comprising:
   said comparator having first and second inputs;
   a first voltage source providing said predetermined reference voltage;
   a switch circuit that samples said predetermined reference voltage during the first phase of the PWM signal and that applies a first voltage indicative of said predetermined reference voltage to said first input of said comparator during the second phase of the PWM signal; and
   said sample circuit being operative to sample a second voltage indicative of said initial voltage of the phase node during the first phase of the PWM signal, to determine said sum voltage by adding said second voltage to the voltage level of the phase node during the second phase of the PWM signal, and to apply said sum voltage to said second input of said comparator.

3. The body diode comparator circuit of claim 1, further comprising:
   said comparator having first and second inputs;
   a first voltage source providing said predetermined reference voltage;

a second voltage source providing a common mode voltage;

a switch circuit that stores a first difference voltage between said predetermined reference voltage and said common mode voltage during the first phase of the PWM signal and that applies said first difference voltage to said first input of said comparator during the second phase of the PWM signal; and said sample circuit being operative to store a second difference voltage between said common mode voltage and said initial voltage of the phase node during the first phase of the PWM signal and to provide a sum of the phase node voltage and said second difference voltage to said second input of said comparator during the second phase of the PWM signal.

4. The body diode comparator circuit of claim 3, wherein:
said switch circuit comprises:
a first capacitor coupled between said first input of said comparator and a first node;
a first switch coupled between said second voltage source and said first input of said comparator;
a second switch coupled between said first voltage source and said first node; and
a third switch coupled between said first node and ground;
wherein said sample circuit comprises:
a second capacitor coupled between said second input of said comparator and the phase node; and
a fourth switch coupled between said second voltage source and said second input of said comparator; and
wherein said first, second and fourth switches are open during the first phase and closed during the second phase of the PWM signal and wherein said third switch is closed during the first phase and open during the second phase of the PWM signal.

5. The body diode comparator circuit of claim 4, further comprising a voltage limiter coupled between the phase node and said second capacitor.

6. The body diode comparator circuit of claim 1, wherein said comparator includes a blanking circuit.

7. A rectified synchronous FET power regulator, comprising:
an upper FET and a lower FET coupled together at a phase node and coupled between an input voltage signal and a reference terminal of a voltage source;
PWM logic that switches said upper and lower FETs based on a PWM signal having first and second states; and
a comparator circuit, coupled to said phase node and said PWM logic, that detects activation state of said lower FET, said comparator circuit comprising:
a sample circuit that samples an initial voltage of said phase node during said first state of said PWM signal and that provides a sum voltage indicative of a sum of said initial voltage and the voltage level of said phase node during said second state of said PWM signal; and
a comparator that compares said sum voltage with a predetermined reference voltage and that provides an output indicative of said activation state of said lower FET.

8. The rectified synchronous FET power regulator of claim 7, wherein said upper and lower FETs comprise MOSFETs.

9. The rectified synchronous FET power regulator of claim 7, wherein said comparator circuit further comprises:
said comparator having first and second inputs;

a first voltage source providing said predetermined reference voltage;
a switch circuit that samples said predetermined reference voltage during said first state of said PWM signal and that applies a first voltage indicative of said predetermined reference voltage to said first input of said comparator during said second state of said PWM signal; and
said sample circuit being operative to sample a second voltage indicative of said initial voltage of the phase node during said first state of said PWM signal, to determine said sum voltage by adding said second voltage to the voltage level of the phase node during said second state of said PWM signal, and to apply said sum voltage to said second input of said comparator.

10. The rectified synchronous FET power regulator of claim 7, wherein said comparator circuit further comprises:
said comparator having a non-inverting and an inverting input;
a first voltage source providing said predetermined reference voltage;
a second voltage source providing a common mode voltage;
a switch circuit that stores a first difference voltage between said predetermined reference voltage and said common mode voltage during said first state of said PWM signal and that provides said first difference voltage to said non-inverting input of said comparator during said second state of said PWM signal; and
said sample circuit being operative to store a second difference voltage between said common mode voltage and said initial voltage of said phase node during said first state of said PWM signal, to add said second difference voltage to said phase node voltage to determine said sum voltage, and to provided said sum voltage to said inverting input of said comparator.

11. The rectified synchronous FET power regulator of claim 10, wherein:
said switch circuit comprises:
a first capacitor coupled between said non-inverting input of said comparator and a first node;
a first switch coupled between said second voltage source and said non-inverting input of said comparator;
a second switch coupled between said first voltage source and said first node; and
a third switch coupled between said first node and said reference terminal of said voltage source;
wherein said sample circuit comprises:
a second capacitor coupled between said inverting input of said comparator and said phase node; and
a fourth switch coupled between said second voltage source and said inverting input of said comparator; and
wherein said first, second, and fourth switches are open during said first state and closed during said second state of said PWM signal and wherein said third switch is closed during said first state and open during said second state of said PWM signal.

12. The rectified synchronous FET power regulator of claim 11, further comprising a voltage limiter coupled between said phase node and said second capacitor.

13. The rectified synchronous FET power regulator of claim 7, wherein said comparator includes a blanking circuit.

14. A method of detecting the activation state of a lower switching FET of a synchronous rectified FET driver which toggles activation of upper and lower switching FETS coupled together at a phase node, said method comprising:

storing a first voltage level indicative of the initial voltage level of the phase node while the lower FET is turned on; and determining when the voltage level of the phase node falls below the initial voltage level by a predetermined amount after the FET driver initiates turning off the lower FET.

15. The method of claim 14, wherein said determining comprises comparing a predetermined reference voltage with the first voltage level added to the voltage level of the phase node.

16. The method of claim 14, further comprising:

said storing a first voltage level indicative of the initial voltage level comprising storing a first voltage difference between a common mode voltage and the initial voltage level;

storing a second voltage difference between the common mode voltage and a predetermined reference voltage level; and said determining comprising comparing the second voltage difference with a sum of the first voltage difference and the voltage level of the phase node.

17. The method of claim 16, wherein said storing a first voltage difference comprises charging a first capacitor having a first end coupled to the phase node and a second end coupled to a common mode voltage source, and wherein said storing a second voltage difference comprises charging a second capacitor having a first end coupled to a reference voltage source and a second end coupled to the common mode voltage source.

18. The method of claim 17, wherein said comparing comprises, after the FET driver initiates turning off the lower FET, switching the second end of the first capacitor to a first input of a comparator, switching the first end of the second capacitor to ground, and switching the second end of the second capacitor to a second input of the comparator.

19. The method of claim 14, further comprising ignoring initial ringing of the phase node immediately after the FET driver initiates turning off the lower FET.

20. The method of claim 14, further comprising turning on the upper FET after the FET driver initiates turning off the lower FET and when the voltage of the phase node falls below the initial voltage level by the predetermined amount.

* * * * *